United States Patent [19]

Kikuchi

[11] Patent Number: 5,753,353
[45] Date of Patent: May 19, 1998

[54] SOI SUBSTRATE

[75] Inventor: Hiroaki Kikuchi, Tokyo, Japan

[73] Assignee: NEC Corporation, Tokyo, Japan

[21] Appl. No.: 554,720

[22] Filed: Nov. 7, 1995

[30] Foreign Application Priority Data

Nov. 7, 1994 [JP] Japan .................................. 6-272088

[51] Int. Cl.⁶ .................................................. H01L 21/02
[52] U.S. Cl. ...................... 428/212; 257/607; 257/611;
257/655; 257/587; 428/336; 428/446; 428/457;
428/704
[58] Field of Search .............................. 428/212, 336,
428/446, 457, 704; 257/607, 611, 655,
587

[56] References Cited

U.S. PATENT DOCUMENTS

| | | |
|---|---|---|
| 4,558,507 | 12/1985 | Okabayashi et al. ................ 357/67 |
| 4,591,654 | 5/1986 | Yamaguchi et al. ................ 357/30 |
| 4,862,244 | 8/1989 | Yamagishi ........................... 357/67 |
| 4,920,062 | 4/1990 | Tsunoda .............................. 437/6 |
| 4,927,776 | 5/1990 | Soejima .............................. 437/33 |
| 5,013,676 | 5/1991 | Horigome ........................... 357/55 |
| 5,293,512 | 3/1994 | Nishigoori et al. ................. 257/622 |
| 5,298,449 | 3/1994 | Kikuchi .............................. 437/63 |
| 5,374,846 | 12/1994 | Takemura ........................... 257/592 |

*Primary Examiner*—Archene Turner
*Attorney, Agent, or Firm*—Young & Thompson

[57] ABSTRACT

An SOI substrate comprises a silicon supporting substrate, an insulating film formed on the top of the silicon supporting substrate and a silicon active layer formed on the insulating film. The silicon supporting substrate is doped with an impurity at a concentration not less than $1\times10^{17}$ atoms/cm$^3$, provided that the impurity is kept in the solid solution state at a solidifying point of silicon. The impurity may comprise boron, phosphorus and arsenic.

6 Claims, 5 Drawing Sheets

SOI SUBSTRATE

BACKGROUND OF THE INVENTION

The present invention relates to a silicon-on-insulator (SOI) substrate, which shows improved gettering of heavy metals as contaminants.

The silicon-on-insulator (SOI) substrate is useful to suppress a latch-up phenomenon and a short channel effect which appear in scaled down semiconductor devices. The silicon-on-insulator (SOI) substrate is also attractive for allowing high speed performance at a low driving voltage.

The scaling down of the size of the device and the increase in density of the integration of the semiconductor circuits can cause another problem, namely contamination of a semiconductor active region by heavy metals such as Fe, Cu, Cr and Ni. The contamination is caused during the fabrication process. The contamination of the semiconductor active region can cause a reduction in the yield of the device, a deterioration of the device performances and a lowering of the reliability. Under these circumstances, the importance of the removal of the heavy metal contaminant from the semiconductor active region has increased.

For a silicon substrate other than an SOI substrate, the following methods may be effective to remove the heavy metal contaminant. An intrinsic gettering method uses, as getters, crystal defects of extraction generated by extracting oxygen from the silicon substrate. A back side gettering method uses, as getters, crystal defects generated by mechanical damages. A polysilicon gettering method uses a polysilicon layer as a getter. A phosphorus doping gettering method uses a diffusion layer highly doped with phosphorus as a getter. The getter is formed at the interior or the bottom of the silicon substrate. The heavy metal contaminant is captured by the getter during heat treatments in the fabrication of the device.

In the SOI substrate, the silicon active layer is separated by an insulating layer from a supporting substrate in which the heavy metal getter is formed. The insulating layer can prevent a diffusion of the heavy metal contaminant from the active region into the supporting substrate.

Figure 1:
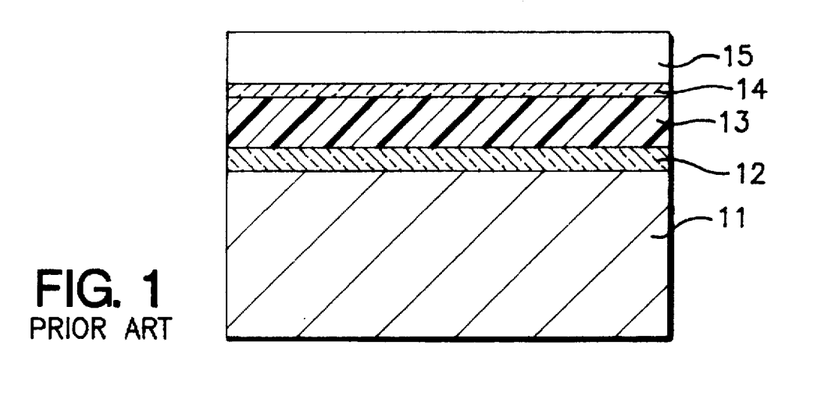
FIG. 1 is a cross sectional elevation view illustrative of the conventional SOI substrate.

To solve this problem, some improvements have been made. One improvement is disclosed in the Japanese laid-open patent application No. 4-199632. FIG. 1 illustrates a structure of the SOI substrate. A first silicon oxide film 12 having a thickness of 1 micrometer is formed on a silicon supporting substrate 11. A gettering sink film 13 is formed on the first silicon oxide film 12. The gettering sink film 13 comprises a polysilicon film having a thickness of 500 nanometers. The gettering sink film 13 acts as a getter for gettering the heavy metal contaminant. A second silicon oxide film 14 is formed on the gettering sink film 13. The second silicon oxide film 14 has a thickness of 20 nanometers which is sufficiently thin for allowing the heavy metals to pass through the second silicon oxide film 14. A silicon active layer 15 is formed on the second silicon oxide film 14.

Figure 2:
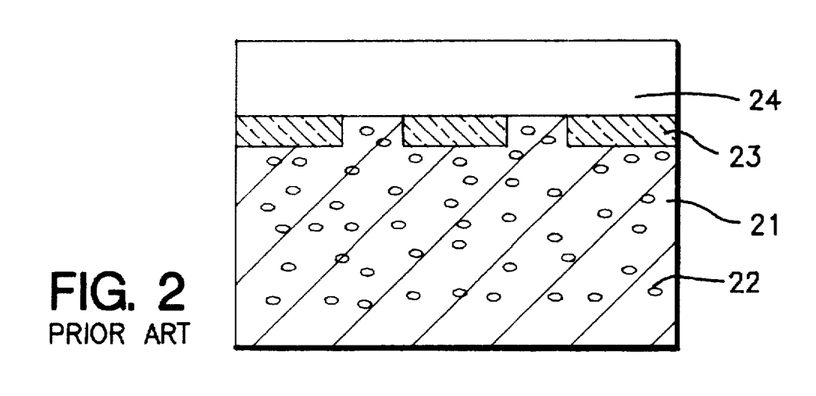
FIG. 2 is a cross sectional elevation view illustrative of the conventional SOI substrate.

Another improvement I disclosed in the Japanese laid-open patent application No. 2-237121. FIG. 2 illustrates a structure of the SOI substrate. An insulating film 23 is partially formed on a silicon supporting substrate 21. A silicon active layer 21 is formed on the insulating film 23 so that the silicon active layer 21 is partially in contact with the silicon supporting substrate 21. The silicon supporting substrate 21 is subjected to the intrinsic gettering treatment so that the silicon supporting substrate 21 has crystal defects 22. The silicon supporting substrate 21 may be prepared as follows. A silicon supporting substrate 21 having an oxygen concentration of $1.5 \times 10^{18}$ atoms/cm$^3$ is prepared and then subjected to a heat treatment at about 700° C. in a nitrogen atmosphere for 10–20 hours, thereby oxygen atoms are extracted from the supporting substrate. As a result, the crystal defects 22 are formed in the silicon supporting substrate 21. The heavy metal contaminant is diffused and moved from the silicon active layer 24 to the silicon supporting substrate 21.

In the prior art described above, the crystal defects are used for gettering. The heavy metal is captured by the gettering during the heat treatment. The above methods cause a super-saturation state of the heavy metal contaminant in the silicon active layer to thereby cause the extraction of the heavy metal contaminant. As a result of the extraction, the heavy metal contaminant is captured by the getter. At a low temperature below 750° C., it is easy to cause the super-saturation state of the heavy metal contaminant. At a high temperature above 800° C., it is difficult to cause the super-saturation state of the heavy metal contaminant. At the low temperature below 750° C., a thermal diffusion of the heavy metal contaminant from the silicon active layer to the silicon supporting substrate is likely to be prevented by the insulating film. At the high temperature above 800° C., it is hard to cause the super-saturation state of the heavy metal contaminant which is necessary for causing the gettering. Once the substrate is subjected to the heat treatment at a higher temperature than the optimum temperature for the gettering, the heavy metal contaminant is likely to elute from the getters in the supporting substrate.

Indeed, the reduction in the thickness of the insulating film is effective to facilitate the diffusion of the heavy metal contaminant from the silicon active layer to the supporting substrate. However, reduction in the thickness of the insulating film makes it difficult to keep the necessary insulating ability.

It has been required to develop a novel SOI substrate which has a sufficient gettering ability.

SUMMARY OF THE INVENTION

Accordingly, it is an object of the present invention to provide a novel SOI substrate, which is free from the above problems.

The above and other objects, features and advantages of the present invention will be apparent from the following descriptions.

The present invention provides an SOT substrate which comprises a silicon supporting substrate, an insulating film formed on the top of the silicon supporting substrate and a silicon active layer formed on the insulating film. The silicon supporting substrate is doped with an impurity at a concentration not less than $1 \times 10^{17}$ atoms/cm$^3$, provided that the impurity is kept in the solid solution state at a solidifying point of silicon. The impurity may comprise boron, phosphorus and arsenic.

The silicon active layer has an impurity concentration not less than $1 \times 10^{15}$ atoms/cm$^3$, provided that the impurity concentration of the silicon supporting substrate is equal to 100 times or more of the impurity concentration of the silicon active layer.

A mono-crystal silicon layer may be provided between the insulating film and the silicon supporting substrate, wherein the mono-crystal silicon layer has an impurity concentration lower than the impurity concentration of the silicon supporting substrate.

The insulating film between the silicon active layer and the silicon supporting substrate has a thickness which satisfy the following relationship, $d \leq \sqrt{(Dt)}/10$, where d is the thickness of the insulating film, t is the time of isothermal treatment of the SOI substrate and D is the diffusion coefficient.

BRIEF DESCRIPTIONS OF THE DRAWINGS

Preferred embodiments of the present invention will be described in detail with reference to the accompanying drawings.

DISCLOSURE OF THE INVENTION

According to the present invention, an SOI substrate comprises a silicon supporting substrate, an insulating film formed on the top of the silicon supporting substrate and a silicon active layer formed on the insulating film. The silicon supporting substrate is doped with an impurity at a concentration not less than $1 \times 10^{17}$ atoms/cm$^3$, provided that the impurity is kept in the solid solution state at a solidifying point of silicon. The impurity may comprise boron, phosphorus and arsenic.

The silicon active layer has an impurity concentration not less than $1 \times 10^{15}$ atoms/cm$^3$, provided that the impurity concentration of the silicon supporting substrate is equal to 100 times or more of the impurity concentration of the silicon active layer.

A mono-crystal silicon layer may be provided between the insulating film and the silicon supporting substrate, wherein the mono-crystal silicon layer has an impurity concentration lower than the impurity concentration of the silicon supporting substrate.

The insulating film between the silicon active layer and the silicon supporting substrate has a thickness which satisfy the following relationship, $d \leq \sqrt{(Dt)}/10$, where d is the thickness of the insulating film, t is the time of isothermal treatment of the SOI substrate and D is the diffusion coefficient.

The insulating film may be formed partially on the top of the silicon supporting substrate.

According to the present invention, neither extraction of oxygen nor crystal defect is utilized. The present invention utilizes the fact that the impurity doped in the silicon supporting substrate can raise the solid solubility of the heavy metals in the silicon supporting substrate. Namely, the impurity doped in the silicon supporting substrate can raise the gettering ability. The gettering ability depends on both the impurity concentration of the silicon supporting substrate and the temperature of the heat treatment for the gettering process. An increase in the temperature of the heat treatment for the gettering process can raise the gettering ability. An increase in the impurity concentration of the supporting substrate can raise the gettering ability. For the present invention, it is not necessary to cause the supersaturation state of the heavy metal contaminant. Even if the SOI substrate is subjected to a high temperature heat treatment, the heavy meats do not elute to the silicon active layer from the getters in the supporting substrate. For those reasons, the present invention is free from the problems described above. It is preferable to carry out the heat treatment for the gettering at a high temperature so that the diffusion of the heavy metals is encouraged sufficiently for passing through the insulating film.

Figure 3A:
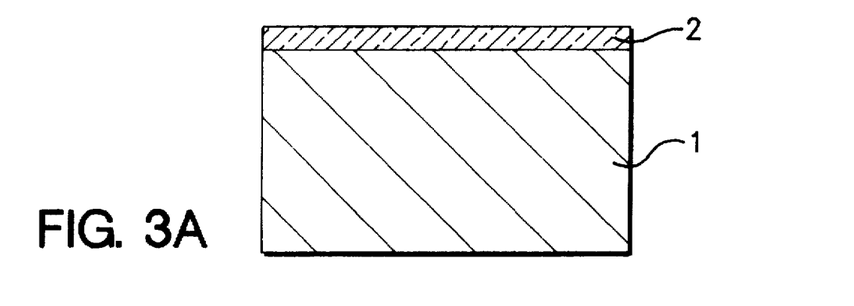
FIGS. 3A–3C are cross sectional elevation views illustrative of novel SOI substrates in a sequential fabrication process in a first embodiment according to the present invention.

A first embodiment according to the present invention will be described, wherein a novel SOI substrate is provided. The novel SOI substrate is fabricated as follows. As illustrated in FIG. 3A, a p-type silicon substrate 1 has an impurity concentration of $1 \times 10^{16}$ atoms/cm$^3$. The silicon substrate 1 is subjected to a thermal oxidation thereby a silicon oxide film 2 having a thickness of about 0.5 micrometers is formed on the top of the silicon substrate 1.

Figure 3B:
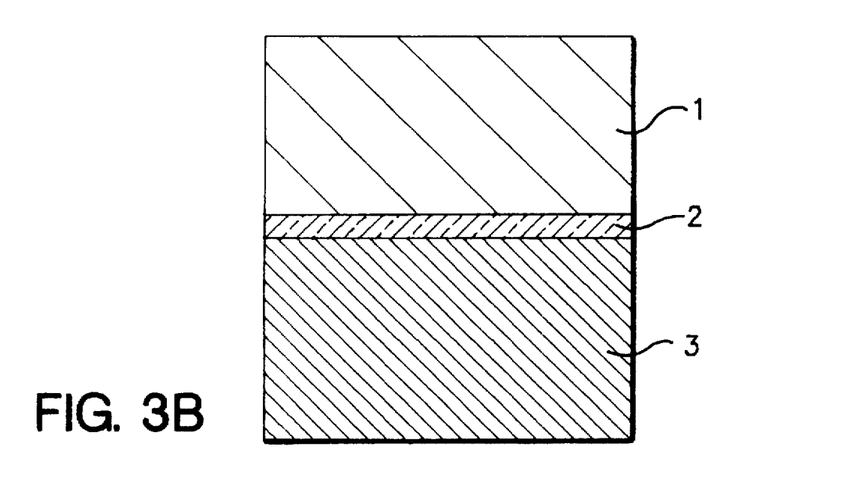

As illustrated in FIG. 3B, a silicon supporting substrate 3 is prepared by doping boron at a concentration of $1 \times 10^{18}$ atoms/cm$^3$ and then adhered on the surface of the silicon oxide film 2 by a heat treatment at 1100° C. in the nitrogen atmosphere for 2 hours. The silicon oxide film 2 is thus sandwiched between the silicon supporting substrate 3 and the silicon substrate 1.

Figure 3C:
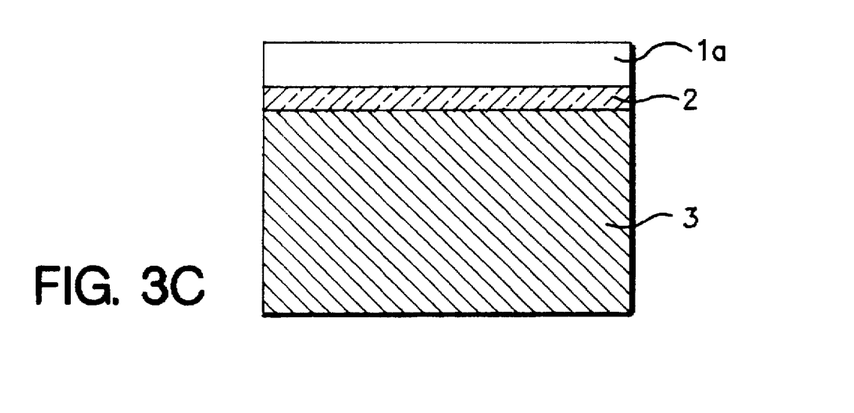

As illustrated in FIG. 3C, the silicon substrate 1 is polished to form a silicon active layer 1a having a thickness of about 2 micrometers. As a result, the silicon active layer 1a is formed on the silicon oxide film 2 which is provided on the silicon supporting substrate 3 highly doped with boron.

As a modification, an n-type impurity may be doped into the silicon supporting substrate 3 at $1 \times 10^{14}$ atoms/cm$^3$.

Figure 4:
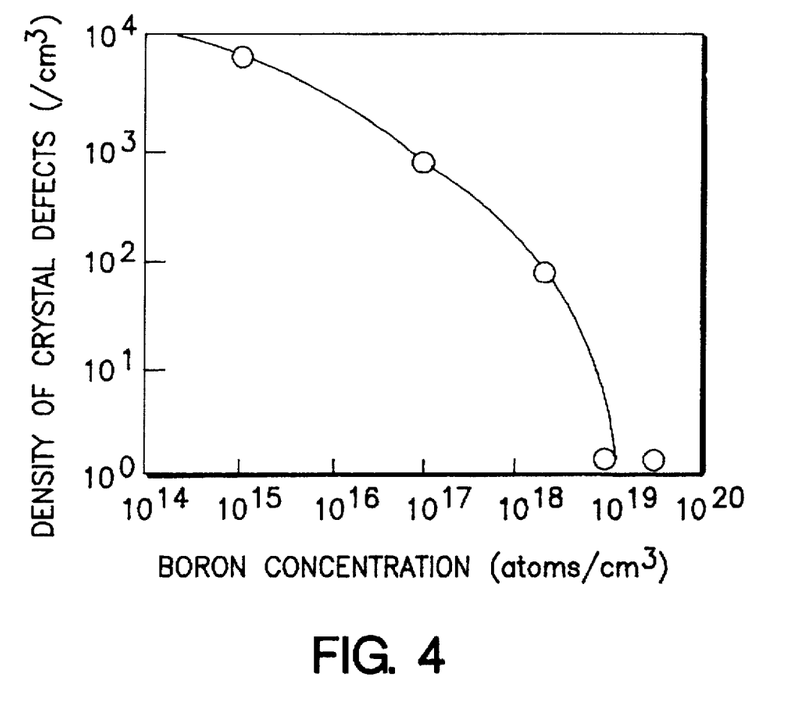
FIG. 4 is a diagram illustrative of the variation in the density of crystal defects in the active layer versus the boron concentration of the silicon supporting substrate.

The gettering ability of the novel SOI substrate was measured. FIG. 4 illustrates the variation in the density of the crystal defects of the silicon supporting substrate 3 versus boron concentration of the silicon active layer 1a, provided that the boron concentration of the silicon active layer 1a is fixed at $1 \times 10^{15}$ atoms/cm$^3$. The contaminant comprises Cu. Cu is applied at a concentration of $1 \times 10^{14}$ atoms/cm$^3$ on the surface of the silicon active layer 1a of the SOI substrate. The SOI substrate is then subjected to a heat treatment at 900° C. n the nitrogen atmosphere for 2 hours. The contaminant Cu is likely to be moved into the silicon supporting substrate 3. Some of the contaminant Cu remain in the silicon active layer 1a. The remaining Cu generates the crystal defects in the silicon active layer 1a. A small density of the crystal defects means the fact that a small number of the contaminant Cu atoms remain in the silicon active layer 1a.

As the boron concentration of the silicon supporting substrate 3 is increased from $1 \times 10^4$ atoms/cm$^3$ to $1 \times 10^{19}$ atoms/cm$^3$, the density of the crystal defects of the silicon supporting substrate 3 is reduced. As the boron concentration of the silicon supporting substrate 3 is increased from $1\times10^{15}$ atoms/cm$^3$ to $1\times10^{17}$ atoms/cm$^3$, the density of the crystal defects of the silicon active layer 1a is reduced to about one tenth. When the boron concentration of the silicon supporting substrate 3 achieves at about $1\times10^{19}$ atoms/cm$^3$, then the gettering of almost all of the Cu is obtained. The increase in the boron concentration of the silicon supporting substrate 3 can raise the amount of Cu in the solid solution state. This relationship is the same when the impurity comprises other atoms such as phosphorus, arsenic and antimony.

A high impurity concentration of the silicon supporting substrate is preferable, but is not required to exceed the critical concentration which is the maximum of the amount of impurity in the solid soluble to silicon at a solidifying point of silicon. Silicon is metal in the crucible set at 1420° C. and then cooled down and solidified at the solidifying point. The solid soluble critical concentration of boron is about $6\times10^{20}$ atoms/cm$^3$. The solid soluble critical concentrations of phosphorus and arsenic are about $2\times10^{20}$ atoms/cm$^3$ and $4\times10^{20}$ atoms/cm$^3$.

The heavy metal contaminant is distributed into the silicon active layer 1a and the silicon supporting substrate 3 on the biases of a constant segregation coefficient which depends on an impurity concentration ratio of the silicon active layer 1a to the silicon supporting substrate 1. When the impurity concentration of the silicon supporting substrate is higher than the impurity concentration of the silicon active layer, then the amount of the heavy metal contaminant to be distributed into the silicon supporting substrate is larger than the amount of the heavy metal contaminant to be distributed into the silicon active layer 1a. Namely, the increase in the impurity concentration of the silicon supporting substrate can arise the gettering ability. It is preferable that the impurity concentration of the silicon supporting substrate is above 100 times of the impurity concentration of the silicon active layer.

The SOI substrate of the first embodiment was compared to an SOI substrate of the comparative example. In the comparative example, the silicon supporting substrate has a boron impurity concentration of $1\times10^{16}$ atoms/cm$^3$. The silicon oxide film has a thickness of 0.5 micrometers. The getter comprises the crystal defect generated by the oxygen extraction method. The SOI substrate is subjected to the Cu contamination.

Figure 5:
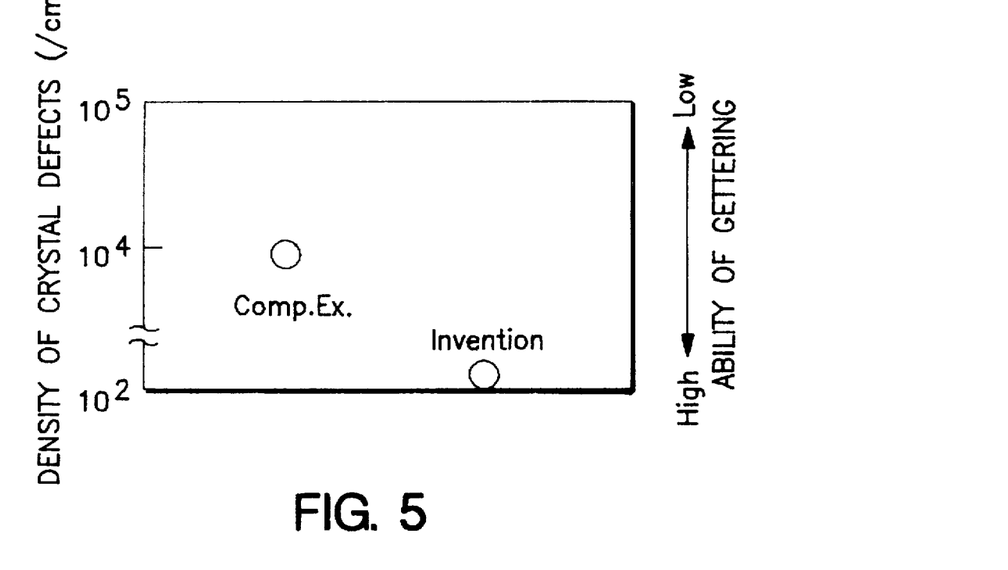
FIG. 5 is a diagram illustrative of the densities of crystal defects in the active layer of the first embodiment and the comparative example.

The SOI substrate of the present invention as illustrated in FIG. 5 shows a low density of the crystal defects in the silicon active layer 1a. The density is $1\times10^2$/cm$^3$. This indicates that the gettering ability is high. By contrast, the SOI substrate of the comparative example shows a high density of the crystal defects in the silicon active layer 1a. The density is $1\times10^4$/cm$^3$. This indicates that the gettering ability is low.

MOS diodes are formed on the SOI substrates of the first embodiment and the comparative example respectively to measure minority carrier life times thereof. In the first embodiment, the minority carrier life time is 2200±300 microseconds. In the comparative example, the minority carrier life time is 700±200 microseconds. This indicates that the SOI substrate of the first embodiment reduces the leakage of current of the device. When DRAMs are formed on the SOI substrate of the first embodiment, the performance of the memory is superior and the device performance and the yield thereof are considerably improved.

The above remarkable effects of the present invention could be confirmed when the contaminant comprises Fe, Ni and Cr.

The following was also confirmed. It is effective to reduce the contaminant concentration to one tenth. It is preferable that the impurity concentration of the silicon supporting substrate 3 is equal to or above $1\times10^{17}$ atoms/cm$^3$.

It is preferable for obtaining the sufficiently high gettering ability that the insulating film has a thickness which satisfy the following relationship. $d \leq \sqrt{(Dt)}10$, where d is the thickness of the insulating film, t is the time of isothermal treatment of the SOI substrate and D is the diffusion coefficient.

Figure 6A:
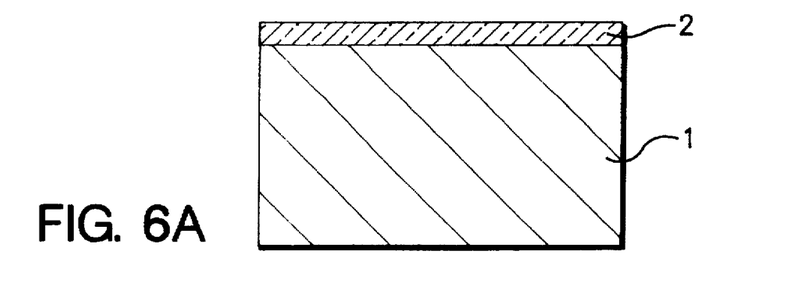
FIGS. 6A–6C are cross sectional elevation views illustrative of novel SOI substrates in a sequential fabrication process in a second embodiment according to the present invention.

A second embodiment according to the present invention will be described, wherein a novel SOI substrate is provided. The novel SOI substrate is fabricated as follows. As illustrated in FIG. 6A, a p-type silicon substrate 1 has an impurity concentration of $1\times10^{15}$ atoms/cm$^3$. The silicon substrate 1 is subjected to a thermal oxidation thereby a silicon oxide film 2 having a thickness of about 0.5 micrometers is formed on the top of the silicon substrate 1.

Figure 6B:
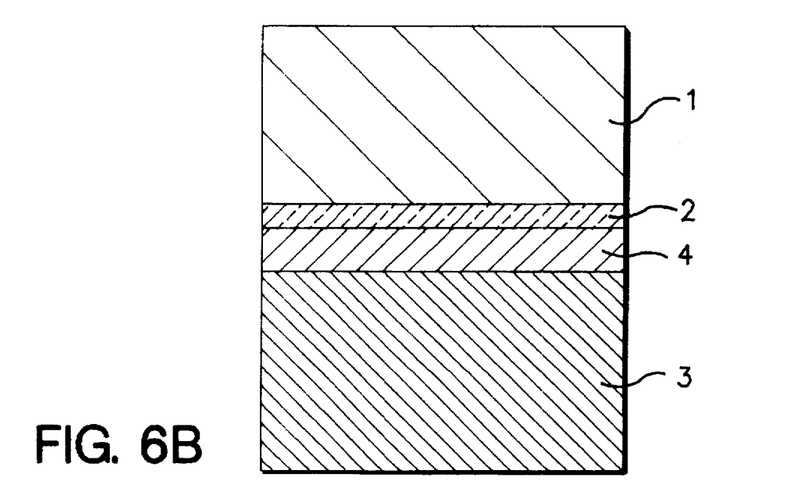

As illustrated in FIG. 6B, a silicon supporting substrate 3 is prepared by doping boron at a concentration of $1\times10^{18}$ atoms/cm$^3$. A silicon epitaxial layer 4 having a thickness of about 20 micrometers and a boron impurity concentration of $1\times10^{16}$ atoms/cm$^3$ is formed on the silicon supporting substrate 3. Thereafter, the silicon epitaxial layer 4 is then adhered on the surface of the silicon oxide film 2 by a heat treatment at 1100° C. in the nitrogen atmosphere for 2 hours. The silicon oxide film 2 is thus sandwiched between the silicon supporting substrate 3 and the silicon substrate 1.

Figure 6C:
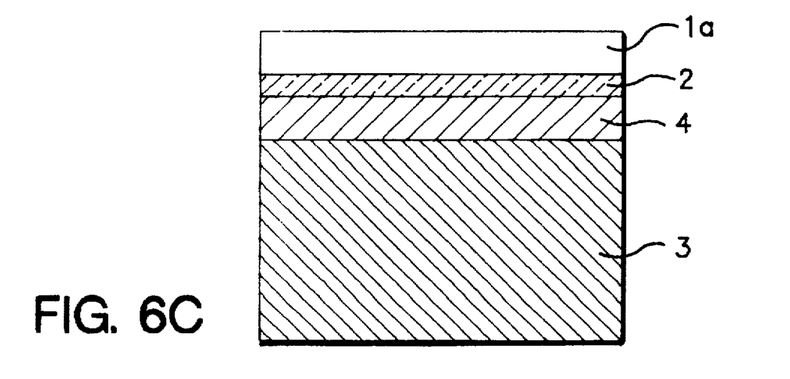

As illustrated in FIG. 6C, the silicon substrate 1 is polished to form a silicon active layer 1a having a thickness of about 0.1 micrometers. As a result, the silicon active layer 1a is formed on the silicon oxide film 2 which is provided on the silicon supporting substrate 3 highly doped with boron.

As a modification, an n-type impurity may be doped into the silicon supporting substrate 3 at $1\times10^{14}$ atoms/cm$^3$.

The gettering ability of the novel SOI substrate was measured. FIG. 4 illustrates the variation in the density of the crystal defects of the silicon supporting substrate 3 versus boron concentration of the silicon active layer 1a, provided that the boron concentration of the silicon active layer 1a is fixed at $1\times10^{15}$ atoms/cm$^3$. The contaminant comprises Cu. Cu is applied at a concentration of $1\times10^{14}$ atoms/cm$^3$ on the surface of the silicon active layer 1a of the SOI substrate. The SOI substrate is then subjected to a heat treatment at 900° C. in the nitrogen atmosphere for 2 hours. The contaminant Cu is likely to be moved into the silicon supporting substrate 3. Some of the contaminant Cu remain in the silicon active layer 1a. The remaining Cu generates the crystal defects in the silicon active layer 1a. A small density of the crystal defects means the fact that a small number of the contaminant Cu atoms remain in the silicon active layer 1a.

As the boron concentration of the silicon supporting substrate 3 is increased from $1\times10^{14}$ atoms/cm$^3$ to $1\times10^{19}$ atoms/cm$^3$, the density of the crystal defects of the silicon supporting substrate 3 is reduced. As the boron concentration of the silicon supporting substrate 3 is increased from 1 $\times10^{15}$ atoms/cm$^3$ to $1\times10^{17}$ atoms/cm$^3$, the density of the crystal defects of the silicon active layer 1a is reduced to about one tenth. As the boron concentration of the silicon supporting substrate 3 achieves at about $1\times10^{19}$ atoms/cm$^3$, then the gettering of almost all of the Cu is obtained. The increase in the boron concentration of the silicon supporting substrate 3 can raise the amount of Cu in the solid solution state. This relationship is the same when the impurity comprises other atoms such as phosphorus, arsenic and antimony.

A possible high impurity concentration of the silicon supporting substrate is preferable, but required not to beyond the critical concentration which is the maximum of the amount of impurity in the solid soluble to silicon at a solidifying point of silicon. Silicon is metal in the crucible set at 1420° C. and then cooled down and solidified at the solidifying point. The solid soluble critical concentration of boron is about $6 \times 10^{20}$ atoms/cm$^3$. The solid soluble critical concentrations of phosphorus and arsenic are about $2 \times 10^{20}$ atoms/cm$^3$ and $4 \times 10^{20}$ atoms/cm$^3$.

The heavy metal contaminant is distributed into the silicon active layer 1a and the silicon supporting substrate 3 on the biases of a constant segregation coefficient which depends on an impurity concentration ratio of the silicon active layer 1a to the silicon supporting substrate 1. When the impurity concentration of the silicon supporting substrate is higher than the impurity concentration of the silicon active layer, then the amount of the heavy metal contaminant to be distributed into the silicon supporting substrate is larger than the amount of the heavy metal contaminant to be distributed into the silicon active layer 1a. Namely, the increase in the impurity concentration of the silicon supporting substrate can arise the gettering ability. It is preferable that the impurity concentration of the silicon supporting substrate is more than 100 times of the impurity concentration of the silicon active layer.

The SOI substrate of the second embodiment was compared to an SOI substrate of the comparative example. In the comparative example, the silicon supporting substrate has a boron impurity concentration of $1 \times 10^{16}$ atoms/cm$^3$. The silicon oxide film has a thickness of 0.5 micrometers. The getter comprises the crystal defect generated by the Cu contamination at $1 \times 10^{13}$ atoms/cm$^2$ and subsequent beat treatment 1100° C. in the nitrogen atmosphere for one hour.

Figure 7:
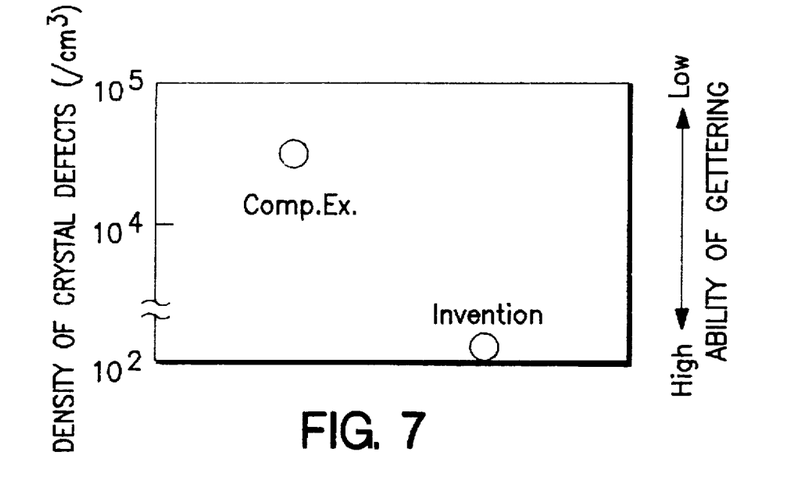
FIG. 7 is a diagram illustrative of the densities of crystal defects in the active layer of the second embodiment and the comparative example.

As illustrated in FIG. 7, the SOI substrate of the present invention shows a low density of the crystal defects in the silicon active layer 1a. The density is $1 \times 10^2$/cm$^3$. This indicates that the gettering ability is high. By contrast, the SOI substrate of the comparative example shows a high density of the crystal defects in the silicon active layer 1a. The density is above $1 \times 10^4$/cm$^3$. This indicates that the gettering ability is low.

MOS diodes are formed on the SOI substrates of the first embodiment and the comparative example respectively to measure minority carrier life times thereof. In the first embodiment, the minority carrier life time is 1500±100 microseconds. In the comparative example, the minority carrier life time is 500±150 microseconds. This indicates that the SOI substrate of the first embodiment reduces the leakage of current of the device. When DRAMs are formed on the SOI substrate of the first embodiment, the performance of the memory is superior and the device performance and the yield thereof are considerably improved.

The above remarkable effects of the present invention could be confirmed when the contaminant comprises Fe, Ni and Cr.

The silicon epitaxial layer prevents boron atoms to move from the silicon supporting substrate 3 to the silicon active layer 1a.

The following was also confirmed. It is effective to reduce the contaminant concentration to one tenth. It is preferable that the impurity concentration of the silicon supporting substrate 3 is equal to or above $1 \times 10^{17}$ atoms/cm$^3$.

It is preferable for obtaining the sufficiently high gettering ability that the insulating film has a thickness which satisfy the following relationship. $d \leq \sqrt{(Dt)}/10$, where d is the thickness of the insulating film, t is the time of isothermal treatment of the SOI substrate and D is the diffusion coefficient.

Figure 8:
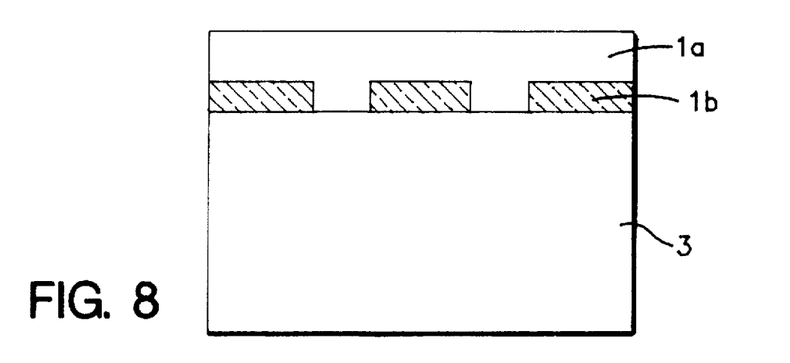
FIG. 8 is a cross sectional elevation view illustrative of a novel SOI substrate in a third embodiment according to the present invention.

A third embodiment according to the present invention will be described, wherein a novel SOI substrate is provided. The novel SOI substrate is illustrated in FIG. 8. An insulating film 2a having a thickness in the range of 0.1 micrometers to 1.0 micrometer is selectively formed on the top of the silicon supporting substrate 3. The silicon supporting substrate is doped with boron at the same concentration as the first embodiment. A silicon active layer 1a having a thickness in the range of 10–50 micrometers is provided on the insulating film 2a so that the silicon active layer 1a is partially in contact with the silicon supporting substrate 3. This structure permits the diffusion of the heavy metal contaminant from the active layer 1a via the gaps of the silicon oxide film 2a to the silicon supporting substrate 3.

Figure 9:
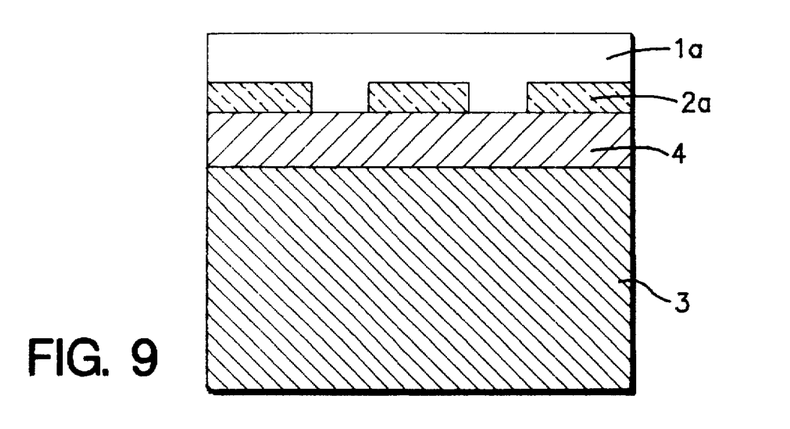
FIG. 9 is a cross sectional elevation view illustrative of a novel SOI substrate in a third embodiment according to the present invention.

A fourth embodiment according to the present invention will be described, wherein a novel SOI substrate is provided. The novel SOI substrate is illustrated in FIG. 9. A silicon epitaxial layer 4 is formed on the silicon supporting substrate 3. The silicon supporting substrate 3 is doped with boron at the same concentration as the first embodiment. An insulating film 2a having a thickness in the range of 0.1 micrometers to 1.0 micrometer is selectively formed on the top of the silicon epitaxial layer 4. A silicon active layer 1a having a thickness in the range of 10–50 micrometers is provided on the insulating film 2a so that the silicon active layer 1a is partially in contact with the silicon epitaxial layer 4. Partially providing the silicon oxide film permits the diffusion of the heavy metal contaminant from the active layer 1a via the gaps of the silicon oxide film 2a to the silicon supporting substrate 3. The silicon epitaxial layer 4 prevents the heavy metal contaminant to be diffused from the silicon supporting substrate 3 to the silicon active layer 1a.

Whereas modifications of the present invention will be apparent to a person having ordinary skill in the art, to which the invention pertains, it is to be understood that the embodiments described by way of illustrations are by no means intended to be considered in a limiting sense. Accordingly, it is to be intended to cover by claims all modifications of the present invention which fall within the sprite and scope of the present invention.

What is claimed is:

1. A silicon-on-insulator substrate comprising:

a silicon supporting substrate doped with an impurity at a concentration not less than $1 \times 10^{17}$ atoms/cm$^3$, provided that the impurity is kept in the solid solution state at a solidifying point of silicon;

an insulating film formed on the top of the silicon supporting substrate, where the insulating film has a thickness $d \leq \sqrt{(Dt)}/10$, where t is the time of isothermal treatment of the silicon-on-insulator substrate and D is the diffusion coefficient; and a silicon active layer formed directly on the insulating film and having an impurity concentration not less than $1 \times 10^{15}$ atoms/cm$^3$, which is 1/100 times or less than said impurity concentration of the silicon supporting substrate.

2. The silicon-on-insulating substrate as claimed in claim 1, wherein the impurity in the active layer comprises boron.

3. The silicon-on-insulating substrate as claimed in claim 1, wherein the impurity in the active layer comprises phosphorus.

4. The silicon-on-insulating substrate as claimed in claim 1, wherein the impurity in the active layer comprises arsenic.

5. The silicon-on-insulating substrate as claimed in claim 1, further comprising a silicon epitaxial layer, having an impurity concentration lower than the impurity concentration of the silicon supporting substrate, between the insulating film and the silicon supporting substrate.

6. A silicon-on-insulating substrate comprising:

a silicon supporting substrate doped with an impurity at a concentration not less than $1\times10^{17}$ atoms/cm$^3$, provided that the impurity is kept in the solid solution state at a solidifying point of silicon;

an insulating film formed on the top of the silicon supporting substrate, where the insulating film has a thickness $d \leq \sqrt{(Dt)}/10$, where t is the time of isothermal treatment of the silicon-on-insulator substrate and D is the diffusion coefficient; and a silicon active layer formed, at least in part, directly on the insulating film and having an impurity concentration not less than $1\times10^{15}$ atoms/cm$^3$, which is 1/100 times or less than said impurity concentration of the silicon supporting substrate, wherein the insulating film is selectively formed so that the silicon active layer is partially in contact with the silicon supporting substrate.

* * * * *